U.S. Patent Number: 6,058,296
Date of Patent: May 2, 2000

United States Patent
Lian et al.

[54] CLUTCH KNOB FOR A CLUTCH MECHANISM FOR A RADIO RECEIVER WITH TUNING DEVICE

[75] Inventors: Ting Ing Lian; Ooi Tsin Tsung, both of Penang, Malaysia; Tazaki Noboru, Tokyo, Japan

[73] Assignees: Sony Corporation, Tokyo, Japan; Sony Electronics (M) SDN. BHD., Penang, Malaysia

[21] Appl. No.: 08/996,017

[22] Filed: Dec. 22, 1997

[30] Foreign Application Priority Data

Dec. 27, 1996 [MY] Malaysia ............................ PI 9605527

[51] Int. Cl.$^7$ ........................................................ H04Q 7/20
[52] U.S. Cl. ......................................... 455/170.1; 455/178.1; 192/46
[58] Field of Search ........................... 455/170.1, 178.1; 192/46, 56.1; 464/37; 74/10 R, 10.41, 527

[56] References Cited

U.S. PATENT DOCUMENTS

| | | | |
|---|---|---|---|
| 3,906,806 | 9/1975 | Harlan | 192/70 |
| 4,566,344 | 1/1986 | Chaki | 74/10.33 |
| 4,702,122 | 10/1987 | Richard | 74/412 |
| 5,351,778 | 10/1994 | Shigemi et al. | 180/167 |
| 5,601,491 | 2/1997 | Chan et al. | 464/37 |

*Primary Examiner*—Edward F. Urban
*Assistant Examiner*—Tilahun Gesesse
*Attorney, Agent, or Firm*—Frommer, Lawrence & Haug, LLP.; William S. Frommer

[57] ABSTRACT

A clutch knob that comprises a body portion and a cover portion. The clutch mechanism includes two integrally formed flexible and resilient sweeper arms attached to the base of the body portion; serrations with alternating smooth troughs and crests which are integrally formed on the inner circumference of the cover portion and the cover portion is fitted onto the body portion and so that the cover portion and the body portion are secured loosely with respect to one another. In addition, the body portion has two integrally formed flexible and resilient sweeper arms that are configured in the shape of pointed arches. The sweeper arms are integrally attached to the base and the circular platform. Further, the apex points of the arches are made smooth and made to point diametrically opposite one another. Moreover, the inner circumference of the serrations of cover portion are configured in the form of the alternating smoothened troughs and crest.

7 Claims, 6 Drawing Sheets

CLUTCH KNOB FOR A CLUTCH MECHANISM FOR A RADIO RECEIVER WITH TUNING DEVICE

FIELD OF INVENTION

This invention relates to a clutch knob for a clutch mechanism that is engageable to a shaft to enable rotations applied to the knob to be correspondingly transmitted to said shaft when connected to said clutch knob. When the clutch is disengaged, the rotation applied to the knob will not be transmitted to the shaft. This device may specifically be employed in the manual tuning knob of, for example, a radio frequency tuner.

PRIOR ART

In general, the currently available manual carrier wave frequency tuner or "station" tuner of radio sets couples the tuner knob (68) to the input shaft (70) of a reduction gear arrangement (68) and the output shaft (71) of said reduction gear arrangement as illustrated in FIG. 1 and FIG. 2. Said output shaft (71) is, in turn, coupled to a rotatable shaft (79) of a ganged tuner air capacitor (76) via coupling means (78). The rotatable shaft (79) is freely rotatable within a range of travel limited by end stops at each end of the range of travel.

To prevent damage to the gears within the reduction gear arrangement (68), a flat metal spring-clip (75) is employed to provide sufficient friction that operates in effect as a clutch mechanism. The manual tuning knob of the tuner is secured to the input shaft (70) by said flat metal spring-clip (75), said spring clip is tensioned to provide the required friction such that the manual tuning knob (69) slips over the rotatable shaft (70) when said shaft reaches the end of its range of travel, or is otherwise prohibited from freely rotating, thereby protecting the gears of the reduction gear arrangement (68) from damage.

However, this arrangement requires frequent tension adjustments to be made to the flat metal spring-clip (75). If tension is to be made to the flat metal spring-clip (75). If tension is adjusted to be too tight, the increased friction gives rise to the undesirable effect of non-slip of the clutch mechanism when the end of the travel of the output shaft (71) is reached or is otherwise unable to freely rotate, and consequently cause damage to said gears within the said reduction gear arrangement (68). If the flat spring-clip (75) is adjusted too loosely, this has the effect of poorly securing the knob (69) to the input shaft (70) causing undesirable slipping which precludes the shaft from rotating in accordance with the knob. To make the clutch mechanism work properly close tolerances had to be maintained in the manufacture of the flat metal spring-clips.

The invention described herein attempts to overcome the above limitations and shortcomings, in particular, to provide a clutch knob that when it is engaged, enables rotations as applied to the knob to be correspondingly transmitted to the shaft that secures the clutch knob. However, when the clutch knob is disengaged, the rotation as applied to the knob will not be transmitted to the shaft and thus damage to the gears could be avoided.

STATEMENT OF INVENTION

The present invention provides for a clutch knob with clutch mechanism comprising two parts: a body portion and a cover portion. The base of the body portion is provided with at least one flexible and resilient sweeper arms while a plurality of serrations with alternating smooth troughs and crests are continuously provided on the inner circumference of the cover portion. The cover portion is fitted and secured onto the body portion when said sweeper arms flexibly engage the corresponding crests and are each flexibly restrained in placed by adjacent troughs.

In one embodiment of the invention, the sweeper arms may be integrally formed with the base of the body portion and are configured in the shape of pointed arches with rounded apex points. Correspondingly, the serrations may also be formed integrally with the cover portion.

In another embodiment, the inner diameter of the body portion, as defined by the point of the apex tip to tip distance of the sweeper arms, may be made marginally smaller than the diametrical distance of the edge of the cover portion.

In an alternative embodiment, the sweeper arms may be provided as two or more arms. Preferably, they are arranged as a plurality of spokes or spoke-like members. When assembled and in operation, the body portion is fitted onto the cover portion which enables the apex points to engage the crests in a tongue-and-groove arrangement.

Such knob may be employed in a radio receiver with tuning device, said radio receiver is comprised of a receiver for receiving a radio frequency broadcast signal, a demodulator for extracting an audio signal from said broadcast signal received by said receiver, and audio signal amplifying means for amplifying and outputting the audio signal extracted by the demodulator. The receiver comprises a ganged air capacitor with manual tuning means for adjusting the broadcast reception frequency thereof, the manual tuning means of the ganged air capacitor comprises a rotatable control shaft for manual adjustment of the value of the ganged air capacitor. The control shaft is connected to a clutch knob of the present invention which comprises a body portion and a cover portion. The body portion comprises a base and a plurality of flexible sweeper arms which are attached to said base.

The cover portion comprises an inner circumference having a plurality of serrations formed thereon, and an outer circumference. The plurality of serrations form a plurality of continuous and alternating troughs and crests. The cover portion is coupled to said base portion so that said plurality of flexible sweeper arms of said base portion interface with the plurality of serrations so as to provide a predetermined resistance which acts to allow transmission of rotational forces on the cover portion to the base portion and onto the control shaft of the ganged air capacitor.

When rotational force applied to the cover portion exceeds the predetermined resistance between the interface of the plurality of flexible sweeper arms and the plurality of serrations, the force is not transmitted to said base portion.

BRIEF DESCRIPTION OF DRAWINGS

In order the present invention may be more readily understood, references are made to the following drawings, by way of example, as applied to a radio tuner in particular.

DETAILED DESCRIPTION OF CERTAIN PREFERRED EMBODIMENTS OF THE INVENTION

Figure 1:
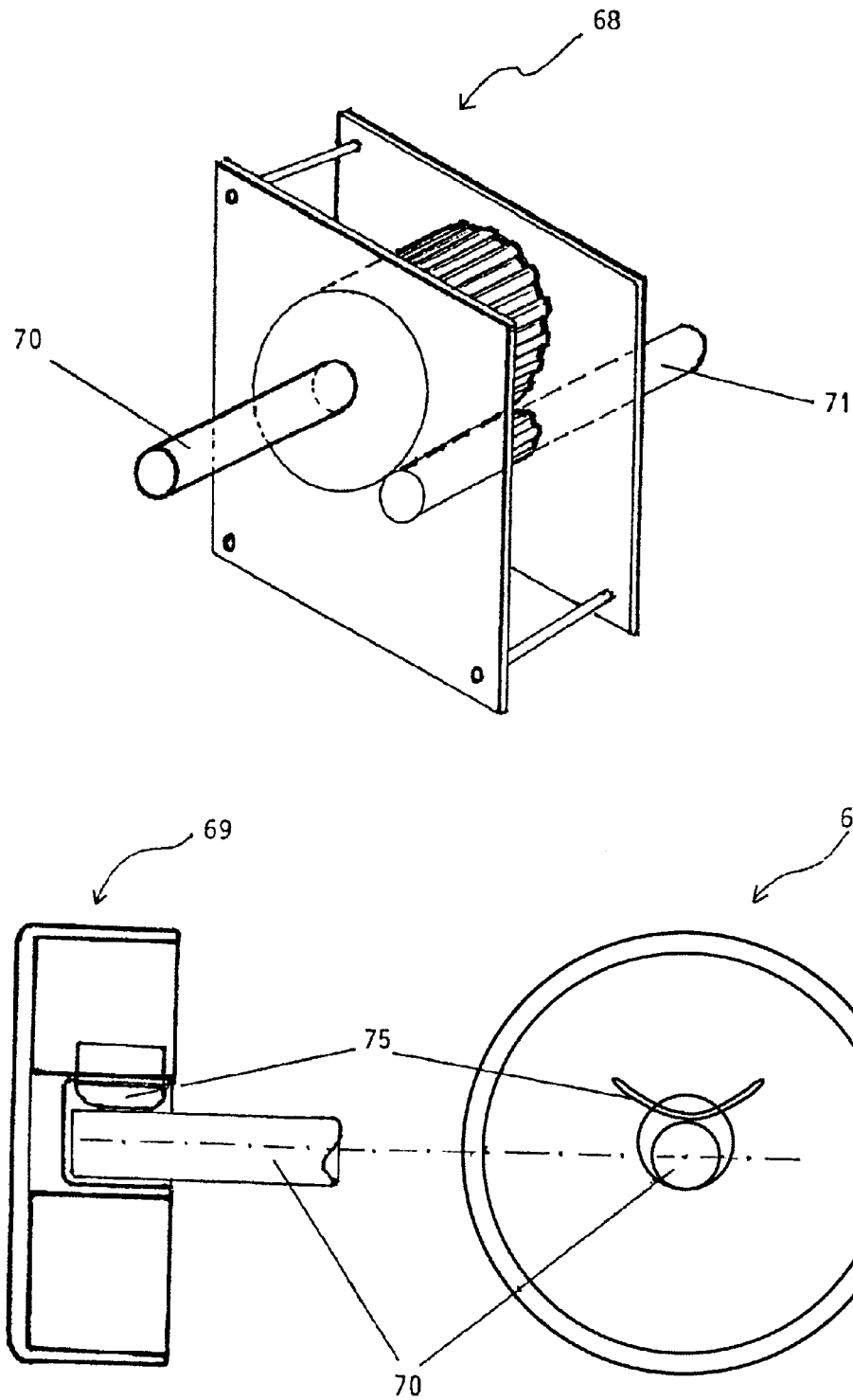
FIG. 1 shows an exploded view of a conventional tuner knob with the clutch mechanism.
Figure 2:
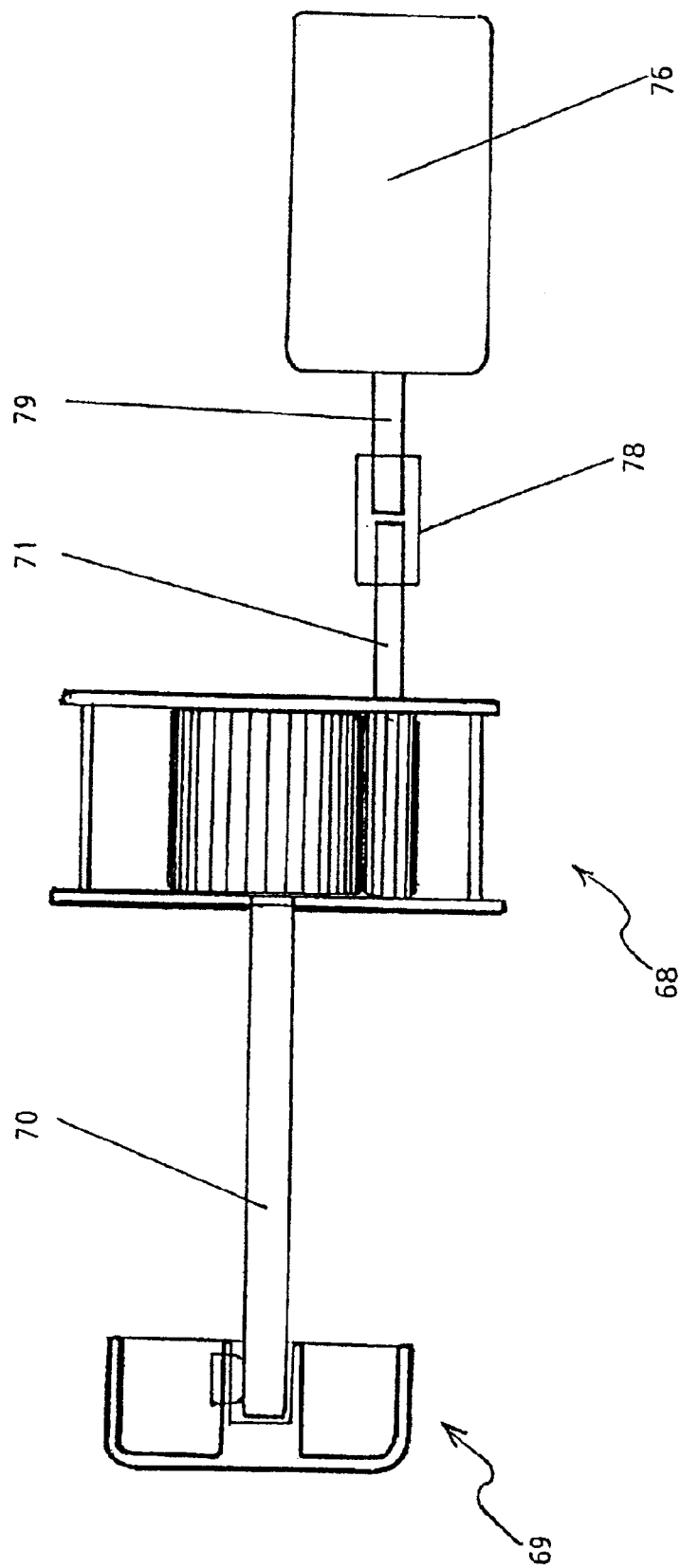
FIG. 2 is another illustration of the conventional tuner knob of FIG. 1 in cross-section.

The invention will now be described in detail with reference to the above-listed drawings, in which FIGS. 1 and 2 have already been discussed in the foregoing Prior Art section.

Figure 3:
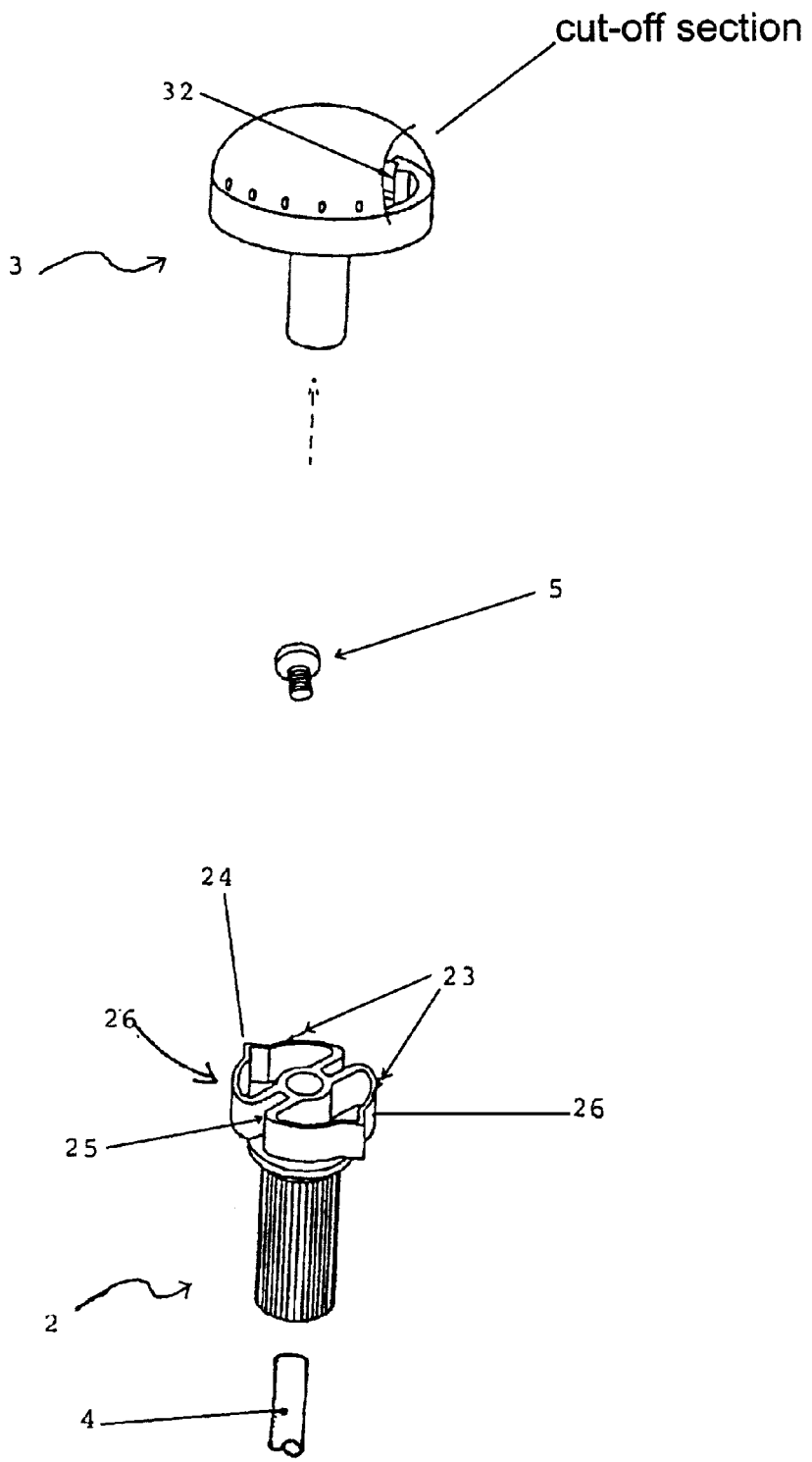
FIG. 3 is an exploded view of a preferred embodiment of a tuner knob with the clutch mechanism in accordance with the teachings of the present invention.

FIG. 3 illustrates the clutch knob of the present invention in an exploded view of the component parts. The clutch knob (1) comprises two parts, a body portion (2) and a cover portion (3).

The body portion (2) is connected to a shaft (4). Screw means (5) may be employed to secure the body portion (2) to the shaft (4). The shaft (4) may comprise the rotatable shaft of reduction gear box or, alternatively, of a ganged air capacitor or switching mechanism of the receiver component of the radio.

The cover portion (3) is fitted onto the body portion (2). A cut-off section of the cover portion (3) shown in this figure illustrates serrations (32) which are formed along the internal circumstance of cover (3).

Figure 4:
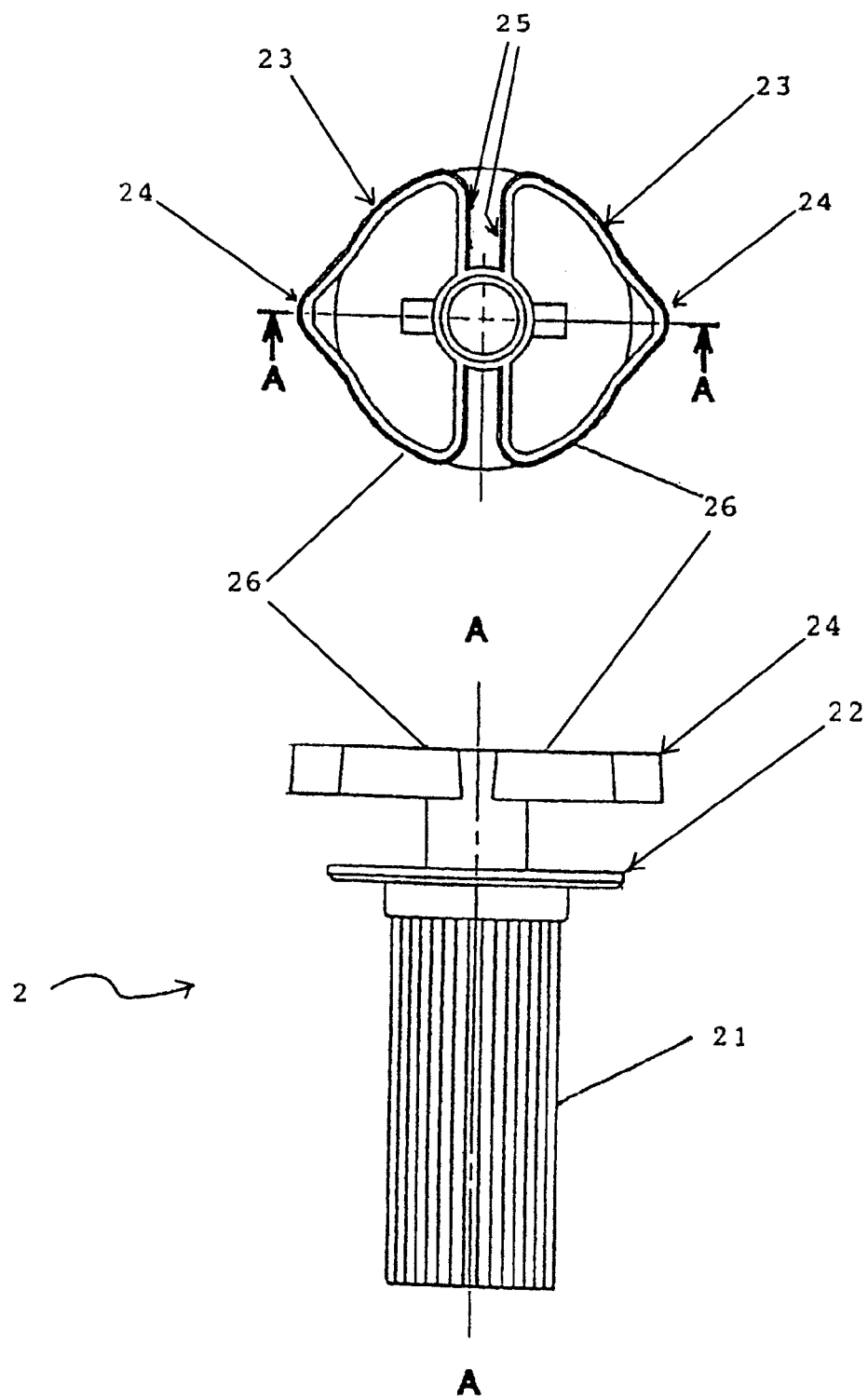
FIG. 4 illustrates several views of the cover portion of the knob of FIG. 3.

Referring now to FIG. 4, the barrel portion (21) of the body (2) is configured to receive a shaft (4). A circular platform (22) may be integrally formed with the barrel (21). The bases (25) of the sweeper arms (26) are also integrally joined to the circular platform (22). The two semi-circular shapes at the bases are merely there to receive the screw (5) that fixes the body (2) to the shaft (4). On a plane substantially parallel to the circular platform (22) and attached to the bases (25) of the sweeper arms (26) are the flexible and resilient pointed gothic-shaped arches (23) of the sweeper arms with their respective apex (24) diametrically held opposite the other.

Figure 5:
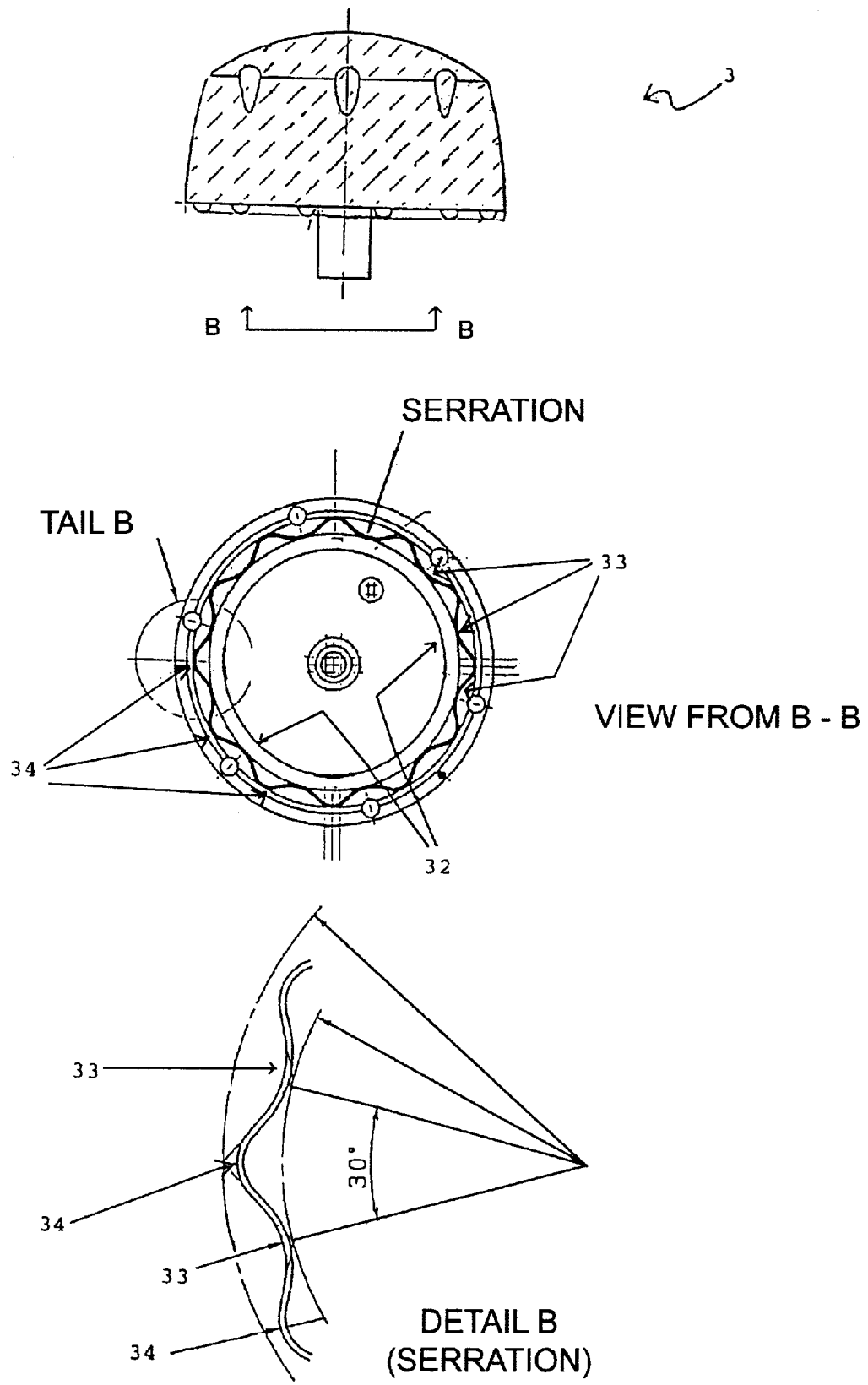
FIG. 5. illustrates several views of the body portion of the knob of FIG. 3.

Referring now to FIG. 5, and in particular the cross-sectional view of the cover portion (3), the inner diameter of the edge (31) is formed marginally smaller than the tip to tip distance between the apex points (24) of the sweeper arms (25). The serration (32) is formed on the inner circumference of the cover portion (3). The serrations (32) comprises a plurality of continuously alternating troughs (33) and crest (34). The diametrical distance between opposite troughs (33) is marginally larger than the tip to tip distance between the apex point (24) of the sweeper arms (25), while the diametrical distance between opposite crests (34) is lesser than the tip to tip distance of the apex point (24).

Figure 6:
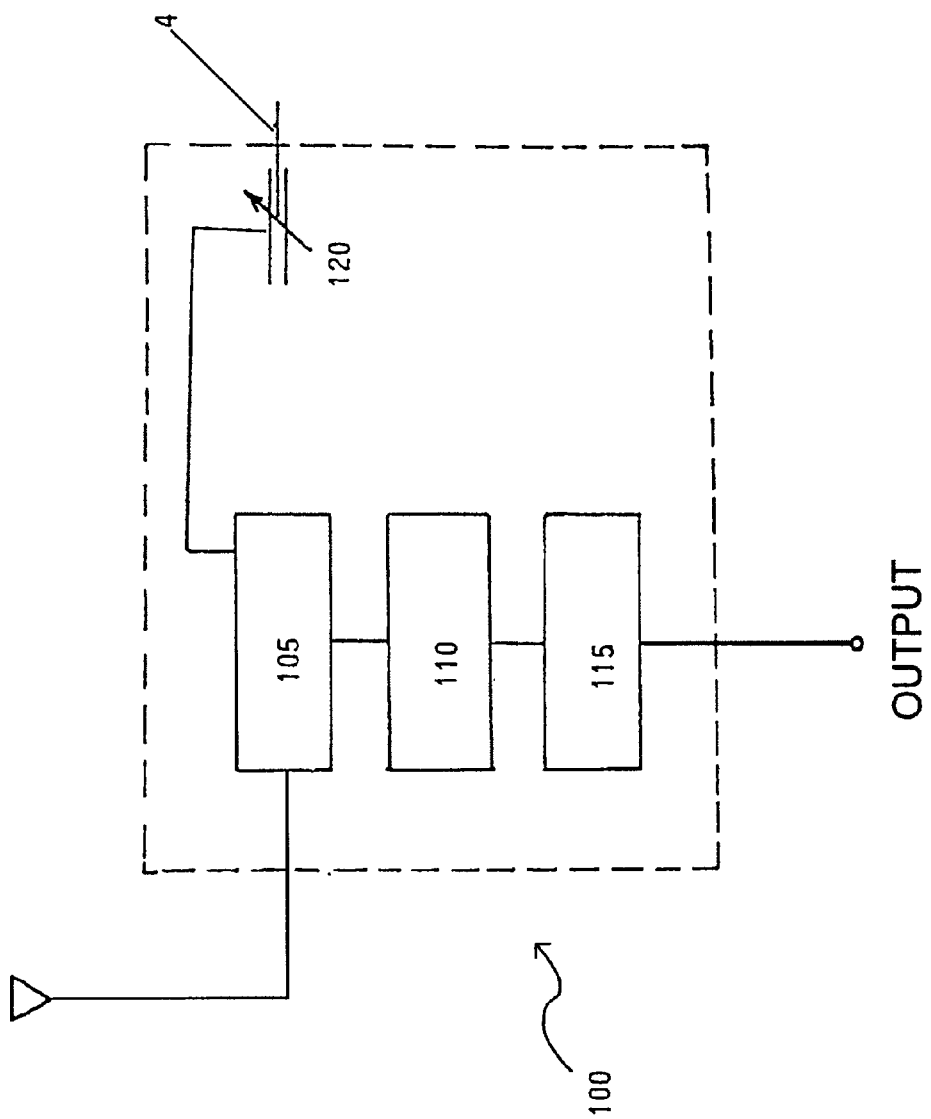
FIG. 6. illustrates a simplified block diagram of a radio receiver employing the tuner knob of the present invention.

As shown in FIG. 6, the clutch knob of the present invention may be employed in a radio receiver which is illustrated in block diagram here wherein a receiver (105) for receiving radio frequency broadcast signals. A demodulator (110) for extracting an audio signal from a radio frequency broadcast signal received by the receiver (105) and an audio amplifier (115) for amplifying an audio signal output from the demodulator (110). The receiver (105) includes a tunable ganged air capacitor (120) for adjusting the reception frequency of the receiver (105). The ganged air capacitor (120) is manually adjusted by rotating the control shaft (4) thereof.

For a freely rotating input shaft (4) of the gear box, when the clutch knob is rotated in a given direction, the sweeper arms (26) of the body portion (2) have sufficient stiffness such that the apex points (24) of the respective sweeper arms (26) engage, (much like gear-teeth engagement), within the troughs (33) of the serrations (32) to transmit the given rotational torque to the shaft (4).

However, if the shaft (4) for any reason is hindered from rotating freely, e.g. the rotation of the shaft reaches end stop; any further rotation of the clutch knob in the same direction will not be transmitted to the input shaft (4) because the clutch mechanism in such situations will start to slip, that is, the flexible sweeper arms (26) of the body portion (2) will yield by distorting the arched shape when the hindering forces or resistance to the rotation of the shaft is greater than the stiffness presented by the resilient arches (23) of the sweeper arms (26) such that the respective apex points (24) will start to trace a slip path from the trough (33) up over the crest (34) of the serration (32) of the cover portion (3) and so on.

The cover portion (3), being axially secured to shaft (4) in a loose or rotatable manner by screw means (5), enables it to be rotated with respect to the body portion (2) and the stationary shaft (4). The slipping clutch will be felt by the person effecting rotations to the clutch knob, indicating that the shaft has reached end stop.

Giving the clutch knob a rotation in the opposite direction will engage the clutch mechanism such that the rotation will be transmitted to the shaft (4). The shaft being free to rotate will rotate in correspondence to the direction of rotation of the clutch knob.

It will be recognized by those skilled in the art, that many variations, modifications and changes can be made to the present invention without departing from the spirit or scope of the present invention as defined by the claims appended hereto.

As an alternative embodiment, it will be recognized that the clutch knob of the present invention may be employed in or in association with, for example, a switching mechanism of an electronic radio frequency tuner/receiver, as opposed to a ganged tuning capacitor or the like. Further, the pointed gothic shaped sweeper arms may take the form of some other equally simple shape such as spokes in a spoked wheel.

In yet other embodiments the fitting arrangement between the cover portion and the body portion of the clutch knob may be configured in the form of tongue-and-groove means. Additionally, the radio frequency receiver of the present invention may comprise a television or video signal receiver.

Thus, in addition to the above-noted alternate embodiments and variations, the inventor claims all simple and minor modifications of the features described herein that can reasonably be regarded as obvious to a person skilled in the art.

We claim:

1. A clutch knob for a clutch mechanism comprising;
    a body portion;
    a cover portion;
    at least one flexible and resilient sweeper arms are provided on the base of the body portion which includes rounded apex points;
    a plurality of serrations with alternating smooth troughs and crests which are continuously provided on the inner circumference of the cover portion; and
    wherein the cover portion is fitted and secured onto the body portion when said sweeper arms flexibly engages the corresponding crests and are each flexibly restrained in place by adjacent troughs, and the body portion is fitted onto the cover portion so as to enable the apex points to engage the crests in a tongue-and-groove arrangement.

2. A clutch knob according to claim 1 wherein the sweeper arms are integrally formed with the base and are configured in the shape of pointed arches.

3. A clutch knob according to claim 2 wherein in the sweeper arm comprises two or more arms.

4. A clutch knob according to claim 2 wherein two or more sweeper arms may be provided on the body portion and arranged as a plurality of spokes or spoke-like members.

5. A clutch knob according to claim 1 wherein the serrations are formed integrally with the cover portion.

6. A clutch knob according to claim 1 wherein an inner diameter of the body portion is defined by the apex tip to tip distance of the sweeper arms is made marginally smaller than the diametrical distance of the edge of the cover portion.

7. A radio receiver with tuning device comprising:

a receiver for receiving a radio frequency broadcast signal, a demodulator for extracting an audio signal from said broadcast signal received by said receiver;

audio signal amplifying means for amplifying and outputting said audio signal extracted by said demodulator;

said receiver comprises a ganged air capacitor with manual tuning means for adjusting the broadcast reception frequency thereof;

said manual tuning means comprises a rotatable control shaft for manual adjustment of the value of said ganged air capacitor;

said control shaft is connected to a clutch knob;

said clutch knob comprises a body portion and a cover portion;

said body portion comprises a base and a plurality of flexible sweeper arms which are attached to said base;

said cover portion comprises an inner circumference having a plurality of serrations formed thereon, and an outer circumference;

said plurality of serrations form a plurality of continuous and alternating troughs and crests;

said cover portion is coupled to said base portion so that said plurality of flexible sweeper arms of said base portion interface with said plurality of serrations so as to provide a predetermined resistance which acts to allow transmission of rotational forces on said cover portion to said base portion and onto said control shaft of said ganged air capacitor; and wherein said rotational force applied to said cover portion exceeds the predetermined resistance between said interface of said plurality of flexible sweeper arms and said plurality of serrations with said force not being transmitted to said base portion.

* * * * *